US008618848B1

(12) United States Patent
Chee

(10) Patent No.: US 8,618,848 B1
(45) Date of Patent: Dec. 31, 2013

(54) CLOCK GENERATOR WITH COMPARATOR ERROR COMPENSATION

(71) Applicant: Touchstone Semiconductor, Inc., Milpitas, CA (US)

(72) Inventor: SanHwa Chee, Fremont, CA (US)

(73) Assignee: Touchstone Semiconductor, Inc., Milpitas, CA (US)

( * ) Notice: Subject to any disclaimer, the term of this patent is extended or adjusted under 35 U.S.C. 154(b) by 0 days.

(21) Appl. No.: 13/665,365

(22) Filed: Oct. 31, 2012

(51) Int. Cl.
*H03K 4/06* (2006.01)
(52) U.S. Cl.
USPC .......................................... 327/131; 327/140
(58) Field of Classification Search
USPC .................. 327/291, 293, 131, 140
See application file for complete search history.

(56) References Cited

U.S. PATENT DOCUMENTS 6,169,433 B1 * 1/2001 Farrenkopf .................... 327/131
7,746,129 B2 * 6/2010 Choi et al. .................... 327/131

OTHER PUBLICATIONS

TS3002 "A 1V/1μA Silicon Oscillator/Timer." Touchstone Semiconductor 2012 pp. 1-10.

* cited by examiner

*Primary Examiner* — Hai L Nguyen
(74) *Attorney, Agent, or Firm* — Gary Stanford

(57) ABSTRACT

A clock generator with comparator error compensation includes an amplifier which develops an error voltage based on a difference between a sample voltage of a charge voltage and a predetermined reference voltage. The charge voltage develops a clock signal, such as a sawtooth waveform. A comparator compares the charge voltage with the error voltage to develop a compare signal. A sample and discharge control network is operative to develop the sample voltage in response to the compare signal, and then to switch between charging and discharging of the charge voltage. The amplifier develops the error voltage to ensure that the charge voltage switches at a level of the reference voltage to eliminate comparator errors, such as switching delay or input offset voltage. A second comparator and another amplifier may be provided to control switching in both directions, such as for developing a triangular waveform or the like.

24 Claims, 7 Drawing Sheets

CLOCK GENERATOR WITH COMPARATOR ERROR COMPENSATION

BACKGROUND OF THE INVENTION

1. Field of the Invention

The present invention relates in general to clock generators, and more particularly to clock generator using a comparator and which compensates for comparator error, including comparator delay and input offset voltage, to improve accuracy of the clock signal frequency.

2. Description of the Related Art

A clock generator is a circuit that produces a clock or timing signal for use in synchronizing circuit operation. Although various different types of clock generators are known, the use of a comparator in the generation of a clock signal is a common configuration. A schematic diagram of a clock generator 100 configured according to a conventional scheme is illustrated in FIG. 1 for developing a sawtooth waveform. A current source 102 coupled to a first supply voltage generates a charge current ICHG which is provided to an oscillation capacitor COSC. The capacitor COSC is coupled between a charge node 104 and a second supply voltage and develops a charge voltage VC on the charge node 104. The first supply voltage is shown herein as VDD and may have any suitable voltage level (positive or negative) relative to the second supply voltage. The second supply voltage is shown herein as VSS and may have any suitable positive, negative or ground voltage level and may be considered as a reference voltage relative to the first supply voltage. VC is provided to a positive input of a comparator 106, which receives a reference voltage VREF at a negative input. As used herein, comparators and amplifiers are described as having positive and negative inputs, where it is understood that the inputs may alternatively be referred to as having non-inverting and inverting inputs, respectively. The comparator (COMP) 106 develops a compare signal CMP at its output, which is provided to an input of a "positive" (POS) one-shot device 108. The POS one-shot device 108 device outputs a discharge signal DCH to a control input of a normally-open switch S1. The POS one-shot device 108 asserts a pulse on the DCH signal in response to a "positive" or rising edge of CMP. The switch S1 has its current terminals coupled in parallel with the capacitor COSC between node 104 and VSS.

FIG. 2 is a timing diagram illustrating operation of the clock generator 100, in which the charge voltage VC and the discharge signal DCH are plotted versus time. At an initial time t0, the voltage of the capacitor COSC is zero so that VC is at VSS. Also at time t0, DCH is low (or logic "0"), the switch S1 is open, and the output of COMP 106, CMP, is also low since VC is less than the reference voltage VREF. The relatively constant charge current ICHG from the current source 102 flows into the capacitor COSC which causes VC to ramp up at a relatively constant rate. VC reaches VREF at a subsequent time t1. COMP 106, however, does not transition CMP at time t1. Instead, after VC reaches VREF and after a delay through COMP 106, it asserts CMP high at a subsequent time t2 which then triggers the one-shot device 108 to pulse DCH high. The one-shot device 108 pulses DCH high and then back low in response to CMP going high, so that DCH goes low at a subsequent time t3. The DCH signal pulsing high momentarily closes the switch S1 to discharge the capacitor COSC so that VC goes back to VSS at or just before time t3. At about time t3, DCH is back low so that switch S1 is re-opened, and the cycle repeats. In this manner, VC oscillates at a relatively constant rate and develops the sawtooth waveform which may be used as a clock signal or otherwise provided to additional clock circuitry (not shown).

The oscillation period, TOSC, of the clock generator 100 is intended to be TC, which is the time the ramping voltage VC rises from its low reset point at VSS to the reference voltage VREF. TC is intended, therefore, to be dependent primarily on the capacitance of COSC, the magnitude of the charge current ICHG, and the voltage level of VREF. The one-shot device 108 adds a short delay time TW which is the width of each DCH pulse. The one-shot device 108 is easily configured to pulse DCH very quickly so that TW<<TC, so that TW is very small and adds only a negligible amount of error. Also, the switch S1 is configured sufficiently large relative to the capacitance of COSC so that COSC is completely discharged relatively quickly within the delay time TW of the DCH pulse, so that there is little or no additional delay caused by discharging the capacitor COSC.

The relative speed of COMP 106, however, is more difficult to control and is a significant contributor of error for relatively high oscillation frequency and/or low bias current of the comparator 106. Furthermore, temperature changes causing speed variations are difficult to reduce or otherwise eliminate. As shown in FIG. 2, after VC reaches VREF, VC continues to increase while COMP 106 is switching, resulting in an additional switching delay time of TS to the overall period. VC thus toggles between VSS and an overshoot voltage VOVR in which VOVR=VREF+VOFF, where VOFF is an offset voltage caused by the additional switching delay time TS of the comparator 106. The actual period of oscillation is TOSC≈TC+TS in which TS, the switching delay of the comparator 106, is an error value which causes an inaccurate period of the sawtooth waveform. The increase in error results in an undesired decrease of the intended or target frequency. It is desired to minimize or otherwise eliminate the switching delay TS of COMP 106.

Another source of comparator error is the input offset voltage of the comparator. The input offset voltage causes the comparator to switch at a different point from VC=VREF even if, solely for purposes of illustration, the comparator error is assumed to be zero. For example, if COMP 106 has an input offset voltage $VIN_{OFF}$ (and again assuming zero switching delay), then it switches when VC=VREF+$VIN_{OFF}$ rather than when VC=VREF. It is noted that $VIN_{OFF}$ is just as likely to be positive or negative for a given comparator so that the input offset voltage error must be added to the delay error to determine the overall error of the comparator. Although not specifically shown, the input offset voltage contributes to the overall comparator error in substantially similar manner as the delay error, so that the actual frequency of the clock generator 100 is difficult to control or predict for a given implementation.

Various conventional methods may be used to reduce the input offset voltage of a comparator. One method is to measure the offset and then use trimming techniques or the like to compensate for the measured offset. Such techniques, however, consume valuable time and manufacturing resources and add substantially to manufacturing cost. Another technique is to increase gain by increasing bias current which tends to reduce the input offset. Increasing gain, however, results in an significant increase in power consumption and does not necessarily eliminate the input offset voltage.

A schematic diagram of a clock generator 300 configured according to another conventional scheme is illustrated in FIG. 3 for developing a triangular waveform. The current source 302 coupled to VDD generates the charge current ICHG which is provided through a second, normally-closed switch S1B to an oscillation capacitor COSC. The capacitor COSC is coupled between a charge node 304 and VSS and develops the charge voltage VC on the charge node 304. The switch S1B has current terminals coupled between the current source 302 and node 304. COMP 106 is replaced by a pair of comparators COMP1 306 and COMP2 310. VC is provided to the positive input of COMP1 306 and to the negative input of COMP2 310. The negative input of COMP1 306 receives a first reference voltage VREF1 and the positive input of COMP2 receives a second reference voltage VREF2. COMP1 develops a set signal "S" at its output which is provided to a set (S) input of a set-reset (SR) latch 308. COMP2 develops a reset signal "R" at its output which is provided to a reset (R) input of the SR latch 308. The Q output of the SR latch 308 device provides a discharge signal DCH which is provided to the inverting control input of the switch S1B and to the control input of a normally-open switch S1A. S1A has current terminals coupled between node 304 and an input of a current sink 312, which as its output coupled to VSS. The current sink 312 develops a discharge current IDCHG for discharging COSC when closed.

FIG. 4 is a timing diagram illustrating operation of the clock generator 300, in which the charge voltage VC and the S, R and DCH signals are plotted versus time. At an initial time t0, the voltage of VC has decreased below a lower threshold voltage level determined by VREF2, so that COMP2 310 asserts R high to reset the SR latch 308. DCH, which was high from a prior cycle, goes low at about time t0 closing switch S1B and opening switch S1A. The discharge current IDCHG from the current sink 312 is thus removed from COSC whereas switch S1B closes so that the charge current ICHG from current source 302 begins charging COSC. VC thus ramps up at a rate determined by the capacitance of COSC and the level of the charge current ICHG. When COMP2 310 sense VC above VREF2, it asserts R back low at about time t1.

At subsequent time t2, VC reaches an upper threshold voltage level determined by VREF1. At subsequent time t3 after a switching delay TS1A from time t2, COMP1 306 asserts S high to set the SR latch 308 pulling DCH back high. In response to DCH going high, switch S1B opens removing ICHG from COSC and switch S1A closes so that the discharge current IDCHG begins discharging COSC. VC thus ramps back down at a rate determined by the capacitance of COSC and the level of the discharge current IDCHG. At about time t4 after a delay of TS1B from time t3, VC crosses VREF1 as it continues to ramp down. When COMP1 306 detects that VC is below VREF1, it asserts S back low at subsequent time t5. At subsequent time t6, VC falls back down to VREF2 once again. At subsequent time t7 after a switching delay TS2A from time t6, COMP2 310 asserts R back high again to reset the SR latch 308 pulling DCH back low to close switch S1B and to open switch S1A. VC begins ramping back up, and at about time t8 after a delay of TS2B from time t7, VC crosses VREF2 as it continues to ramp up.

Operation repeats in this manner so that VC oscillates at a relatively constant rate and develops the triangular waveform which may be used as a clock signal or otherwise provided to additional clock circuitry (not shown). VC toggles relative to the threshold voltages VREF1 and VREF2 at a duty cycle based on the relative values of ICHG and IDCHG. The clock generator 300 exhibits similar inaccuracies as the clock generator 100, however, due to comparator switching delays of COMP1 306 and COMP2 310.

VC is intended to toggle between VREF1 and VREF2, shown as a rising period TC1 and a falling period TC2. The desired period of oscillation is desired to be TOSC=TC1+TC2. In actual operation, however, VC rises above VREF1 and falls below VREF2 every cycle. The delay of the comparator 306 causes a significant delay of TS1A+TS1B at the peak of the triangular waveform, and the delay of the comparator 310 causes another significant delay of TS2A+TS2B at the valley of the triangular waveform. The actual period of oscillation is TOSC=TC1+TC2+TS1A+TS1B+TS2A+TS2B, which is significantly greater than the desired period. In this manner, the overall period of the resulting triangular waveform is significantly greater than intended so that the target frequency is correspondingly reduced. In a similar manner previously described for the comparator 106, it is desired to minimize or otherwise eliminate the switching delays of the comparators 306 and 310.

COMP1 306 and COMP2 310 further introduce input offset voltage error in a similar manner described for COMP 106. In the same manner, the input offset voltage of each comparator contributes to the overall comparator error in substantially similar manner as the delay error, so that the actual frequency of the clock generator 300 is also difficult to control or predict for a given implementation. The conventional methods to compensate for the input offset voltage either consume valuable resources and increase overall cost or substantially increase power consumption.

SUMMARY OF INVENTION

A clock generator with comparator error compensation according to one embodiment may include an oscillator capacitor which develops a charge voltage, a first sample capacitor which develops a first sample voltage, a first sample switch coupled between the oscillator capacitor and the first sample capacitor, a charge circuit, a discharge circuit, a first comparator, a sample and discharge control network, and a first amplifier. The charge circuit is configured to charge the oscillator capacitor towards a first voltage level and the discharge circuit is configured to discharge the oscillator capacitor towards a second voltage level. The first comparator is configured to compare the charge voltage with a first error voltage and to provide a first compare signal indicative thereof. The sample and discharge control network is configured to control the first sample switch to cause the charge voltage to be sampled by the first sample capacitor as the first sample voltage in response to the first compare signal, and which is configured to then control the discharge circuit to discharge the oscillator capacitor. The first amplifier is configured to provide the first error voltage based on a difference between the first sample voltage and a predetermined first reference voltage, where the first reference voltage corresponds with a target level of the first voltage level.

The first amplifier is part of a feedback portion which controls a level of the first error voltage so that the charge voltage charges to the first reference level without overshooting or undershooting the first reference level. In one embodiment, the charge circuit continuously charges the oscillation capacitor and the discharge circuit comprises a switch which shorts the terminals of the oscillation capacitor to develop a sawtooth waveform.

In a second embodiment, the clock generator may further include a second sample capacitor which develops a second sample voltage, a second sample switch coupled between the oscillator capacitor and the second sample capacitor, a second comparator configured to compare the charge voltage with a second error voltage and to provide a second compare signal indicative thereof, and a second amplifier. The second amplifier is configured to provide the second error voltage based on a difference between the second sample voltage and a predetermined second reference voltage, where the second reference voltage corresponds with a target level of the second voltage level. The charge circuit may include a charge switch coupled to a current source for charging the oscillator capacitor when the charge switch is closed, and the discharge circuit may include a discharge switch coupled to a current sink for discharging the oscillator capacitor when the discharge switch is closed. In this case, the sample and discharge control network is further configured to control the discharge circuit to discharge the oscillator capacitor by closing the discharge switch and by opening the charge switch. The sample and discharge control network may further be configured to control the second sample switch to cause the charge voltage to be sampled by the second sample capacitor as the second sample voltage in response to the second compare signal, and to then open the discharge switch and close the charge switch.

The second amplifier is also part of a feedback portion which controls a level of the second error voltage so that the charge voltage discharges to the second reference level without overshooting or undershooting the second reference level. In one embodiment, the charge circuit charges the oscillation capacitor when the charge switch is closed and the discharge circuit discharges the oscillation capacitor when the discharge switch is closed to develop a triangular waveform.

In additional embodiments, each sample switch and capacitor may be supplemented with another sample switch and sample capacitor in a back-to-back configuration to achieve enhanced stability. In one embodiment, the first sample switch and first sample capacitor samples the charge node, and the second sample switch and second sample capacitor transfers the sampled charge to an input of the error amplifier. In one embodiment, each first sample capacitor is smaller than the oscillator capacitor, and the second sample capacitor is larger then the first sample capacitor. In one embodiment, the second sample capacitor may be about the same size as the oscillator capacitor to achieve enhanced stability without using a large capacitor, which is advantageous for integrated circuit configurations.

A method of generating a clock signal with comparator error compensation according to one embodiment may include changing a charge signal towards a first level in a first operative state, and changing the charge signal towards a different second level in a second operative state, comparing the charge signal with a first error signal and providing a first compare signal indicative thereof, sampling the charge signal in response to the first compare signal and providing a first sample signal, amplifying a difference between the first sample signal and a predetermined first reference level and providing the first error signal indicative thereof, and switching between the first and second operative states after sampling the charge signal in response to the first compare signal and providing the first sample signal.

The method may further include comparing the charge signal with a second error signal and providing a second compare signal indicative thereof, sampling the charge signal in response to the second compare signal and providing a second sample signal, amplifying a difference between the second sample signal and a predetermined second reference level and providing the second error signal indicative thereof, in which first reference level corresponds with the first level of the charge signal and the second reference level corresponds with the second level of the charge signal, switching from the first operative state to the second operative state after sampling the charge signal and providing the first sample signal in response to the first compare signal, and switching from the second operative state to the first operative state after sampling the charge signal and providing the second sample signal in response to the second compare signal.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
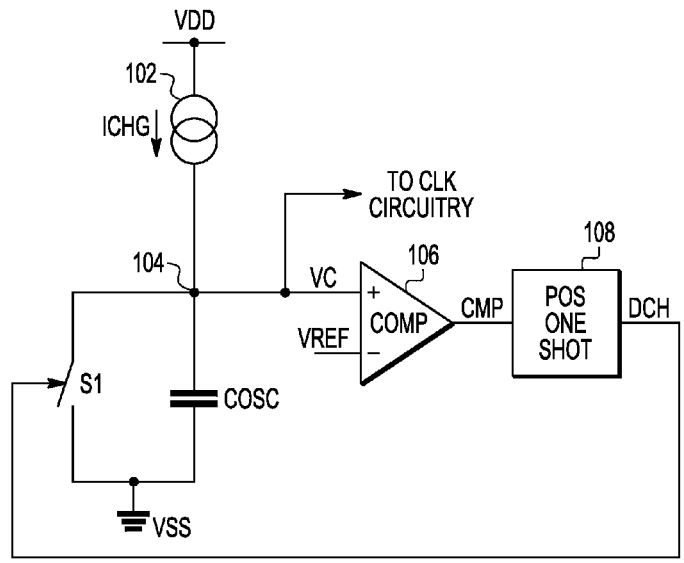
FIG. 1 is a schematic diagram of a conventional clock generator using a comparator configured for developing a sawtooth waveform.
Figure 2:
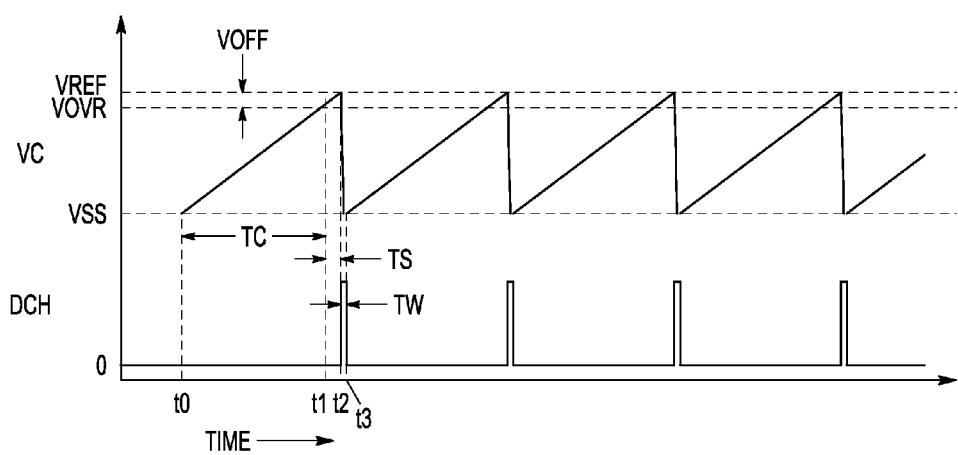
FIG. 2 is a timing diagram illustrating operation of the conventional clock generator of FIG. 1.
Figure 3:
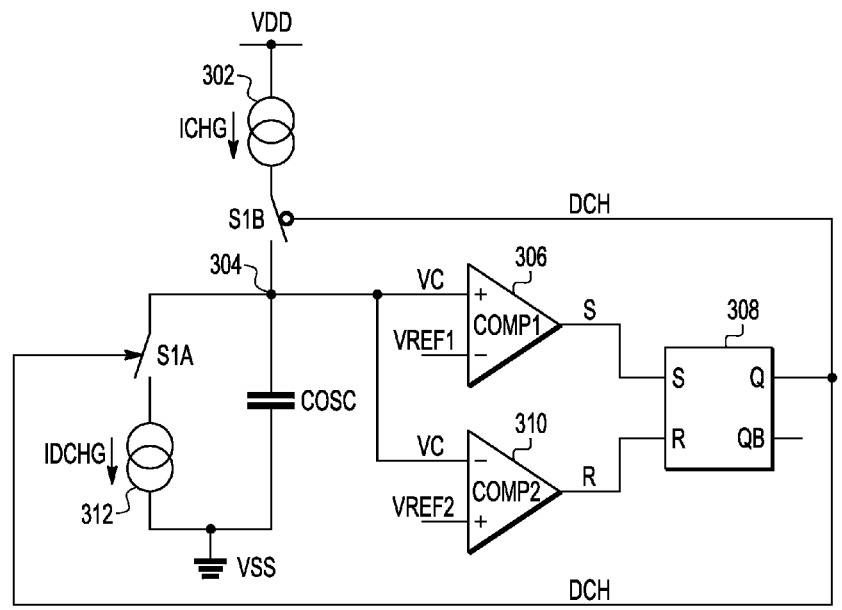
FIG. 3 is a schematic diagram of a conventional clock generator using comparators for developing a triangular waveform.
Figure 4:
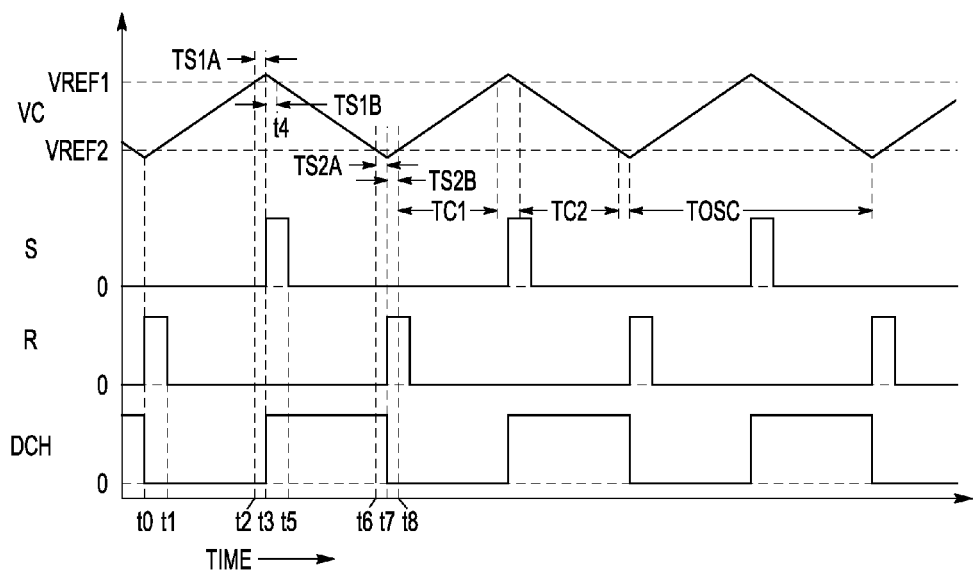
FIG. 4 is a timing diagram illustrating operation of the conventional clock generator of FIG. 3.
Figure 5:
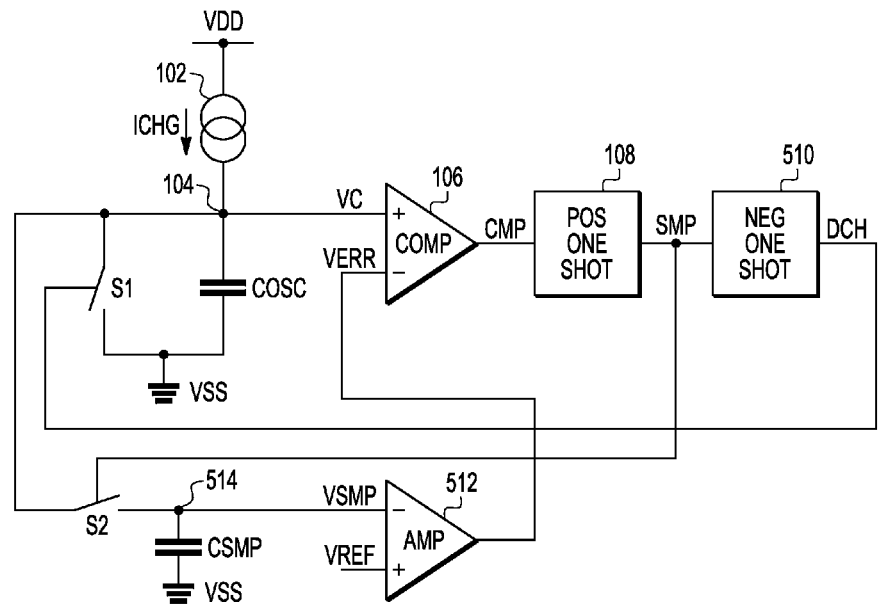
FIG. 5 is a schematic diagram of a clock generator implemented with comparator error compensation according to one embodiment of the present invention for developing a sawtooth waveform.

FIG. 5 is a schematic diagram of a clock generator 500 implemented with comparator error compensation according to one embodiment of the present invention for developing a sawtooth waveform. The clock generator 500 has similar components as the clock generator 100 which assume identical reference numbers. In particular, the clock generator 500 includes the current source 102, the oscillation capacitor COSC, the switch S1, the comparator 106 and the one-shot device 108 which are coupled in a similar manner as previously described for the clock generator 100, but with improvements as described herein. The current source 102 developing charge current ICHG is coupled between VDD and node 104, the charge capacitor COSC is coupled between node 104 and VSS, and the switch S1 has its current terminals coupled between node 104 and VSS in a similar manner. Node 104 develops charge voltage VC provided to the positive input of COMP 106, having its output providing the compare signal CMP. The one-shot device 108 receives CMP at its input.

In addition, the clock generator 500 includes a negative (NEG) one-shot device 510, a second normally-open switch S2 referred to as sample switch S2, a sample capacitor CSMP, and an amplifier 512. The output of the first one-shot device 108 develops a sample signal SMP which is instead provided to a control input of the switch S2 and to the input of the NEG one-shot device 510. The NEG one-shot device 510 operates in substantially the same manner as the POS one-shot device 108 except that it triggers on a negative or falling edge of the SMP signal. It is noted that the one-shot devices described herein are examples of trigger devices which provide a momentary pulse transition at their outputs in response to a triggering event at their inputs. The triggering event may be a signal transition, such as a rising edge or falling edge or the like, or any other signal condition, such as reaching a predetermined level or the like. The output of the NEG one-shot device 510 develops a discharge signal DCH which is provided to the control input of the switch 51. S2 has its current terminals coupled between charge node 104 and a sample node 514, in which node 514 develops a sample voltage VSMP. The sample capacitor CSMP is coupled between the sample node 514 and VSS. VSMP is provided to the negative input of the amplifier 512, which receives the reference voltage VREF at its positive input. The output of the amplifier 512 develops an error voltage VERR which is provided to the negative input of the comparator 106 rather than VREF.

Figure 6:
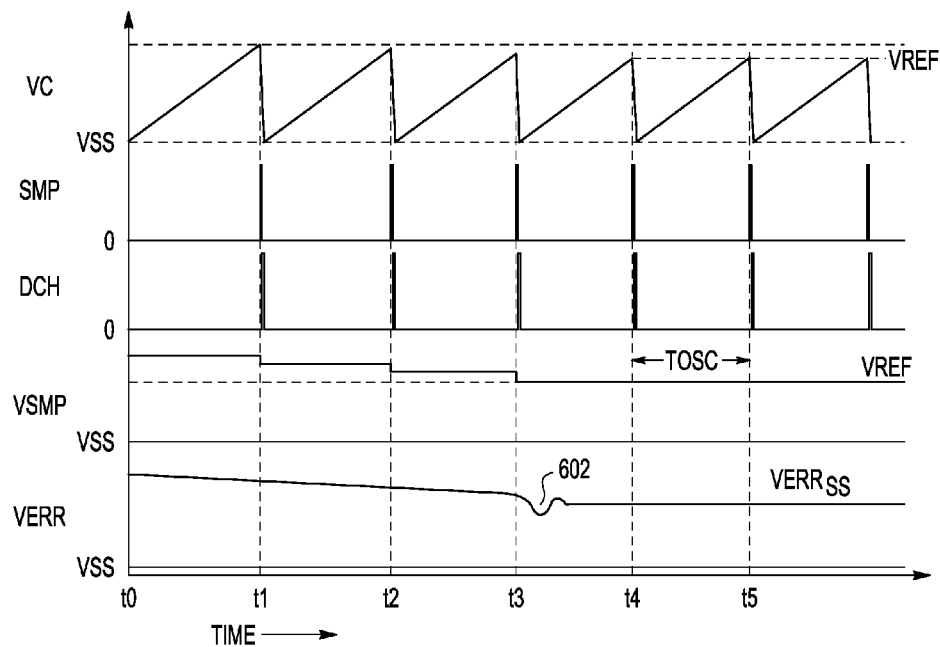
FIG. 6 is a timing diagram illustrating operation of the clock generator of FIG. 5.

FIG. 6 is a timing diagram illustrating operation of the clock generator 500, in which the charge voltage VC, the sample signal SMP, the discharge signal DCH, the sample voltage VSMP and the error voltage VERR are plotted versus time. At an initial time t0, the voltage of the capacitor COSC is about zero so that VC is at about VSS. SMP and DCH are both assumed low (or logic "0") so that both of the switches S1 and S2 are open. VSMP and VERR are initially shown at arbitrarily high voltage levels, although the actual voltage levels of VSMP and VERR may not be known at startup. It is understood, however, that the initial values of VSMP and VERR are inconsequential in that the closed loop configuration adjust these values in subsequent cycles of operation as further described herein.

VC is ramping up at an initial time t0 in a similar manner previously described as COSC is charged by ICHG. At subsequent time t1, VC reaches a peak level which is shown greater than the target value VREF. The actual peak level may depend on various initial circuit conditions. In the first cycle, in fact, the peak level may actually be less than VREF depending upon the initial circuit conditions. It is assumed for sake of illustration that VSMP is greater than VREF due to the speed of COMP 106 in which VC rises above VREF by a significant amount. When COMP 106 finally does trigger at time t1 when VC is above VREF, CMP goes high which causes the POS one-shot device 108 to pulse SMP high. SMP pulsing high momentarily closes sample switch S2 so that charge is transferred from node 104 to the sample capacitor CSMP. VSMP thus assumes a voltage level substantially equal to the peak of VC at about time t1.

The falling edge of the pulse of SMP is detected by the NEG one-shot device 510, which then pulses DCH high to momentary close switch S1. In a similar manner previously described, the momentary closure of switch S1 is sufficient to completely discharge COSC so that VC quickly decreases to VSS a very short time after time t1. Since the NEG one-shot device 510 pulses DCH high in response to the falling edge of SMP, the switch S2 is re-opened before switch S1 is closed so that the peak voltage of VC is sampled as voltage VSMP before COSC is discharged. Once DCH falls back low soon after time t1, VC ramps up again from VSS to initiate the next cycle and operation which essentially repeats in subsequent cycles. As shown, however, VSMP decreases somewhat to reflect the value of VC just after time t1, so that closed loop operation changes the circuit parameters during the initial cycles.

At subsequent time t2, VC has exceeded VERR and COMP 106 once again triggers causing SMP and DCH to be sequentially pulsed. The SMP pulse causes sample switch S2 to momentarily close to generate a new sample of VC as VSMP on node 514. The DCH pulse causes momentary closure of switch S1 to discharge COSC and reset VC back to VSS. In the second cycle, however, VC peaks at a value less than the original peak value and is closer to the target level VREF. Also, VSMP decreases towards VREF. Meanwhile VERR is shown adjusting towards a steady state level VERR$_{SS}$ through operation of the error amplifier 512. At subsequent time t3 when COMP 106 switches, the peak level of VC has further decreased towards VREF and VSMP substantially equals VREF. A slight fluctuation of VERR may occur when VSMP is substantially equal to VREF as shown at 602.

The cycle substantially repeats and when COMP 106 switches at subsequent time t4, the peak level of VC is substantially equal to VREF and VSMP remains substantially equal to VREF. Operation achieves steady state thereafter as shown at time t5. In this manner, over a course of several periods, the voltage of VSMP converges to VREF commensurate with the target peak level of VC. The voltage of VERR reaches its steady state level VERR$_{SS}$, having a level which compensates for and effectively eliminates the switching delay time TS of the comparator 106. In the steady state condition, VC toggles between VSS and VREF and the oscillation period TOSC of the clock generator 500 is substantially equal to the target period TC, or TOSC≈TC ignoring one-shot delays.

In this manner, the switching delay of the comparator 106 is effectively eliminated. The comparator 106 switches based on an error voltage and the voltage of the charge node. When the comparator 106 switches, the charge voltage is sampled and the difference between the sampled charge voltage and the reference voltage is amplified to generate the error voltage which is fed back to the comparator 106. The error voltage is adjusted by closed loop control to compensate for comparator switching delay. The closed loop control further compensates for any input offset voltage of the comparator 106, so that input offset voltage is effectively eliminated in similar manner for similar reasons. In this manner, significant comparator errors are effectively eliminated.

Comparator switching delay and/or input offset voltage in conventional configurations resulted in an actual frequency which was difficult to predict or control and which was usually different from, such as less than, the desired or target frequency. A clock generator with comparator error compensation as described herein compensates for the comparator error which results in a significantly more accurate frequency level. In this manner, the timing accuracy of a comparator-based clock generator, such as the clock generator 500, is substantially improved since substantially most, if not all, of the comparator error becomes inconsequential.

Any error of the final frequency level is substantially caused by the combined delays of the one-shot devices 108 and 510, which is negligible compared to the switching delay of the comparator 106 and/or any additional error caused by comparator input offset voltage.

Figure 7:
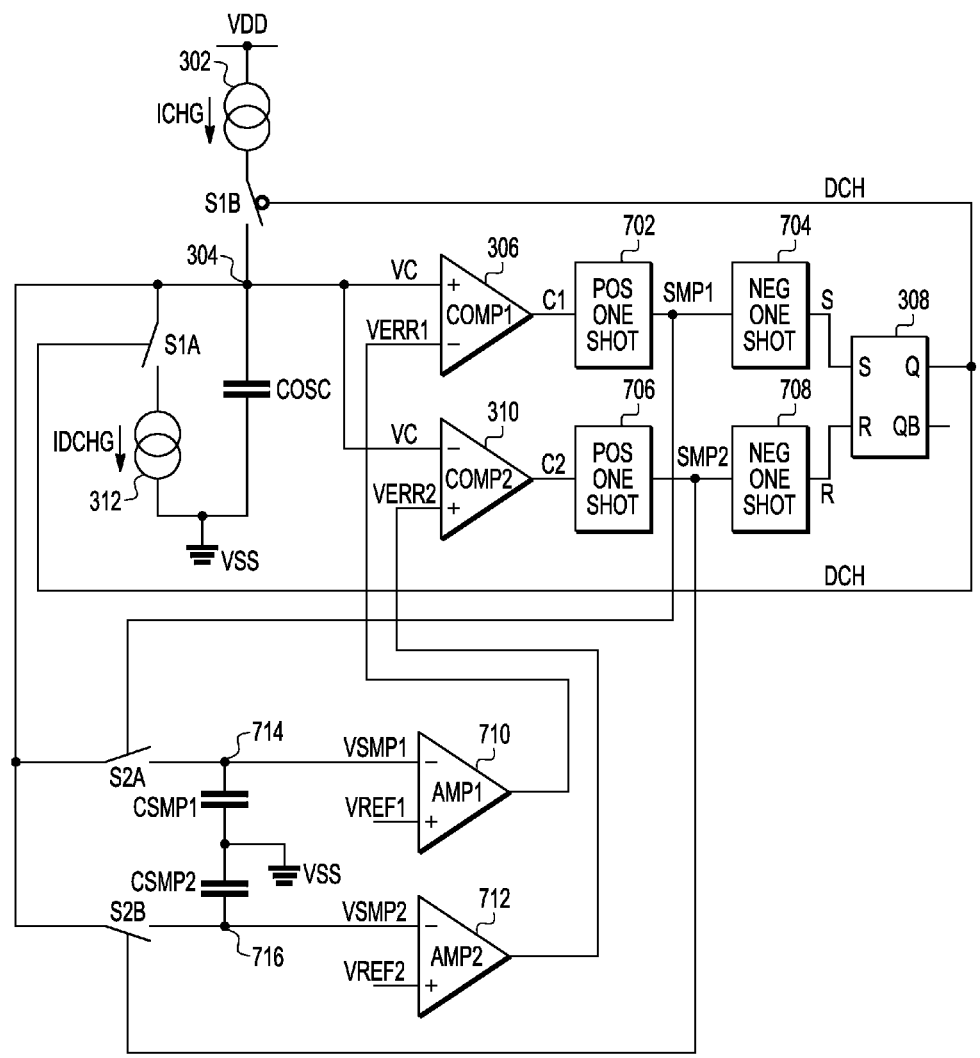
FIG. 7 is a schematic diagram of a clock generator implemented with comparator error compensation according to another embodiment of the present invention for developing a triangular waveform.

FIG. 7 is a schematic diagram of a clock generator 700 implemented with comparator error compensation according to one embodiment of the present invention for developing a triangular waveform. The clock generator 700 has similar components as the clock generator 300 which assume identical reference numbers. As described for the clock generator 500 for eliminating delay caused by the comparator 106, similar improvements are applied to the clock generator 300 for eliminating delays of the comparators 306 and 310. The clock generator 700 includes some of the components of the clock generator 300 coupled in similar manner and which assume identical reference numbers. In particular, the current devices including source 302 and sink 312, the switches S1A and S1B, the comparators 306 and 310 and the latch 308 are provided and coupled in similar manner, but with improvements as described herein. In addition, the clock generator 700 includes POS one-shot devices 702 and 706 and NEG one-shot devices 706 and 708, an additional pair of normally-open switches S2A and S2B, a pair of sample capacitors CSMP1 and CSMP2, and a pair of amplifiers 710 and 712.

The current source 302 providing the charge current ICHG is coupled in series with the current terminals of switch S1B between VDD and the charge node 304. COSC is coupled between the charge node 304 and VSS. The current sink 312 providing the discharge current IDCHG is coupled in series with the current terminals of switch S1A between node 304 and VSS. Node 304 develops charge voltage VC which is provided to the positive input of COMP1 306, having its output developing a compare signal C1. VC is also provided to the negative input of COMP2 310, having its output developing another compare signal C2. SR latch 308 has its Q output providing the discharge signal DCH to the inverting control input of the switch S1B and to the control input of the switch S1A.

The clock generator 700 further includes the POS one-shot device 702 having an input receiving signal C1 and an output asserting a first sample signal SMP1, which is provided to the input of the NEG one-shot device 704 and to the control terminal of the switch S2A. The output of the NEG one-shot device 704 asserts a set signal S to the set input of the SR latch 308. The POS one-shot device 706 has an input receiving signal C2 and an output asserting a second sample signal SMP2, which is provided to the input of the NEG one-shot device 708 and to the control terminal of the switch S2B. The output of the NEG one-shot device 708 asserts a reset signal R to the reset input of the SR latch 308.

The current terminals of switch S2A are coupled between node 304 and a first sample node 714 developing a first sample voltage VSMP1, and the current terminals of switch S2B are coupled between node 304 and a second sample node 716 developing a second sample voltage VSMP2. Sample capacitor CSMP1 is coupled between node 714 and VSS and sample capacitor CSMP2 is coupled between node 716 and VSS. VSMP1 is provided to a negative input of the first amplifier 710, having its positive input receiving a first reference voltage VREF1 and having its output providing a first error signal VERR1 to the negative input of COMP1 306.

VSMP2 is provided to a negative input of the second amplifier 712, having its positive input receiving a second reference voltage VREF2 and having its output providing a second error signal VERR2 to the positive input of the COMP2 310.

Figure 8:
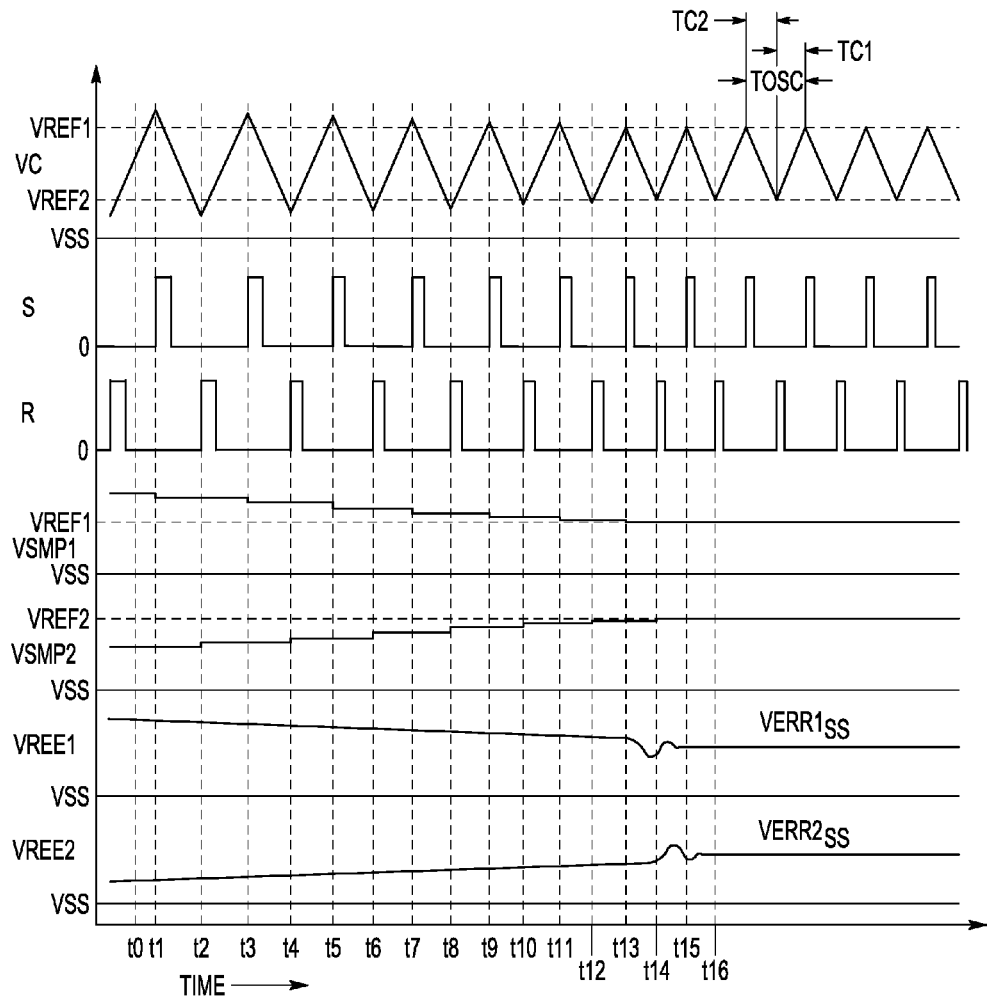
FIG. 8 is a timing diagram illustrating operation of the clock generator of FIG. 7.

FIG. 8 is a timing diagram illustrating operation of the clock generator 700, in which the charge voltage VC, the set and reset signals S and R, the sample voltages VSMP1 and VSMP2, and the error voltages VERR1 and VERR2 are plotted versus time. At an initial time t0, the SR latch 308 was previously reset so that Q is low, the switch S1B is "on" or closed, and the switch S1A is "off" or opened. Thus, the charge voltage VC is ramping up as the charge current ICHG charges COSC. VSMP1 is assumed to be initially above VREF1 and VSMP2 is initially assumed to be below VREF2 at time t0. Also, VERR1 is assumed to have a relatively high voltage and VERR2 is assumed to have a relatively low voltage as shown. It is noted that the initial voltage levels of VSMP1, VSMP2, VERR1 and VERR2 are arbitrary and may depend upon initial circuit conditions. Regardless of their initial voltage levels, closed loop control over multiple cycles as further described herein ensures that they settle to their intended operating voltage levels.

At subsequent time t1, COMP1 306 switches after detecting that VC has risen above VERR1 pulling C1 high. The POS one-shot device 702 pulses SMP1 high to momentarily close switch S2A so that the peak voltage level of VC is sampled as voltage VSMP1 on node 714. VSMP1 decreases slightly at time t1. The falling edge of the pulse of SMP1 causes the NEG one-shot device 704 to pulse signal S high setting the SR latch 308, so that DCH opens switch S1B and closes switch S1A. The back-to-back POS and NEG one-shot devices 702 and 704 ensure that switch S2A is reopened before switching of S1A and S1B. The combined delay of the one-shot devices 702 and 704 is negligible and not illustrated in FIG. 8. The discharge current IDCHG is applied to COSC, which begins discharging after time t1 so that VC ramps back down. COMP1 306 pulls C1 back low soon after VC falls below VERR1.

At subsequent time t2, COMP2 310 switches after detecting that VC has fallen below VERR2 pulling C2 high. The POS one-shot device 706 pulses SMP2 high to momentarily closing switch S2B so that the valley voltage level of VC is sampled as voltage VSMP2 on node 716. VSMP2 increases slightly at time t2. The falling edge of the pulse of SMP2 causes the NEG one-shot device 708 to pulse signal R high resetting the SR latch 308, so that DCH closes switch S1B and opens switch S1A. The back-to-back POS and NEG one-shot devices 706 and 708 ensure that switch S2B is reopened before switching of S1A and S1B. The combined delay of the one-shot devices 706 and 708 is negligible and not illustrated in FIG. 8. The charging current ICHG is applied to COSC, which begins charging after time t2 so that VC ramps back upwards. COMP2 310 pulls C2 back low soon after VC rises above VERR2.

Operation continues in successive cycles in which VC ramps up to corresponding peak values while S1B is closed and S1A is opened within time ranges t2-t3, t4-t5, t6-t7, t8-t9, t10-t11, t12-t13, t14-t15, etc., and ramps down to corresponding valley values while S1B is opened and S1A is closed within time ranges t3-t4, t5-t6, t7-t8, t9-t10, t11-t12, t13-t14, t15-t16, etc. During successive peak times, VSMP1 decreases towards VREF1 and during successive valley times, VSMP2 increases towards VREF2. Further, VERR1 adjusts to the corresponding steady state value $VERR1_{SS}$ and VERR2 adjusts to the corresponding steady state value $VERR2_{SS}$. The steady state voltage level of VERR1 compensates for and effectively eliminates the switching delay time of the comparator 306. The steady state voltage level of VERR2 compensates for and effectively eliminates the switching delay time of the comparator 310. At about time T16 after about 8 cycles, VSMP1 settles at VREF1 and VSMP2 settles at VREF2, and VC toggles between VREF1 and VREF2 as desired.

As previously described, the overshoot/undershoot of the peak and valley voltages of VC relative to VREF1 and VREF2 caused by comparator delay results in the frequency being significantly less than the target frequency. Eliminating comparator delay results in a significantly more accurate frequency level. As shown in FIG. 8, since VC rises between VREF2 and VREF1 for period TC1, and falls from VREF1 back to VREF2 for period TC2, the period of oscillation of the clock generator 700 is substantially equal to the target period, or TOSC≈TC1+TC2 ignoring negligible one-shot delays.

In this manner, the switching delays of the comparators 306 and 310 are effectively eliminated. Each comparator switches based on a corresponding error voltage and the voltage of the charge node. When each comparator switches, the charge voltage is sampled and the difference between the sampled charge voltage and a corresponding reference voltage is amplified to generate a corresponding error voltage which is fed back to the corresponding comparator. Each error voltage is adjusted by closed loop control to compensate for comparator switching delay. The closed loop control further compensates for any input offset voltage error of each comparator, so that the input offsets are effectively eliminated in similar manner and for similar reasons. In this manner, comparator errors are effectively eliminated.

Comparator switching delay and/or input offset voltage in conventional configurations resulted in an actual frequency which was difficult to predict or control and which was usually different from, such as less than, the desired or target frequency. A clock generator with comparator error compensation as described herein compensates for each comparator error which results in a significantly more accurate frequency level. In this manner, the timing accuracy of a comparator-based clock generator, such as the clock generator 700, is substantially improved since substantially most, if not all, comparator error becomes inconsequential.

Any error of the final frequency level is substantially caused by the combined delays of the one-shot devices 702/704 and 706/708 and the latch 308, which delays are negligible compared to the switching delays of the comparators 306 and 310 and/or any additional error caused by input offset voltage of each comparator.

At least one advantage of the comparator error compensation scheme for a clock generator as described herein is that a very low bias current may be used for the comparators and amplifiers while still achieving greater accuracy of the frequency of oscillation without concern for slow comparator speed. A comparator error compensation scheme in accordance with that described herein automatically adjusts and compensates for comparator error including delay and input offset voltage. Valuable resources to reduce such errors, such as measurement and trimming, are unnecessary so that significant cost savings are achieved. Very low bias current reduces overall power consumption which is particularly advantageous for configurations used in battery-powered electronic devices.

Accuracy of the clock generator may further be enhanced by applying an auto zeroing scheme and/or a chopping scheme to the amplifiers to reduce any input offset of the amplifiers. It is noted, however, that the comparator error compensation scheme as described herein renders such techniques unnecessary as applied to the comparators.

Figure 9:
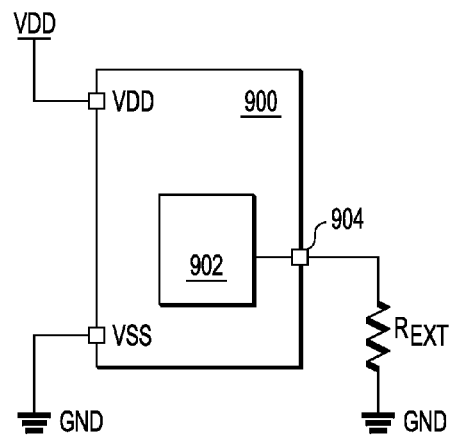
FIG. 9 is a simplified block diagram of a chip or integrated circuit incorporating an clock generator implemented according to an embodiment of the present invention with adjustable frequency of operation.

FIG. 9 is a simplified block diagram of a chip or integrated circuit (IC) 900 incorporating an clock generator 902 implemented according to an embodiment of the present invention. The IC 900 includes voltage supply pins VDD and VSS for coupling to external supply voltages. As shown, the IC 900 includes a VDD pin externally coupled to supply voltage VDD, and a VSS pin externally coupled to ground (GND). The clock generator 902 is integrated onto the IC 900 and represents any of the clock generators described herein, such as either one of the clock generators 500 or 700 or the like. Although only the clock generator 902 is shown on the IC 900, it is understood that the IC 900 may include other circuitry or components in which the clock generator 902 may only be a portion of the circuitry of the IC 900. Alternatively, the IC 900 may be a timing chip or the like in which one or more clock generators are incorporated thereon.

The IC 900 incorporates substantially the entire portion of the clock generator 902 except that an external resistor $R_{EXT}$ may be provided to allow external adjustment of the operating frequency. As shown, the clock generator 902 is internally coupled to an external pin 904 of the IC 900. The external resistor $R_{EXT}$ is an external component which may be coupled between the pin 904 and GND. The configuration of the external resistor $R_{EXT}$ provides flexibility for determining the frequency of oscillation by selection of the resistance of $R_{EXT}$. In one embodiment, $R_{EXT}$ is used to adjust the charge current ICHG (e.g., provided by current source 102 or 302) which in turn adjusts the frequency of operation. In one embodiment, ICHG is increased to a higher current level with a smaller resistance value of $R_{EXT}$.

It has been determined that stability of operation is enhanced when each sample capacitor CSMPx is larger than the capacitance of COSC, in which CSMPx represents the capacitance of any one of the capacitors CSMP, CSMP1 or CSMP2. For the clock generator 500, for example, it may be desired to have the capacitance of CSMP be about ten (10) times that of COSC. When integrated onto a chip, such as the IC 900, the sizes of the capacitors COSC and CSMPx are fixed and limited depending upon the particular process technology employed. It has further been determined that stability may be an issue at higher frequencies of operation for the clock generators 500 and 700 when the resistance of $R_{EXT}$ is at a lower value.

Figure 10:
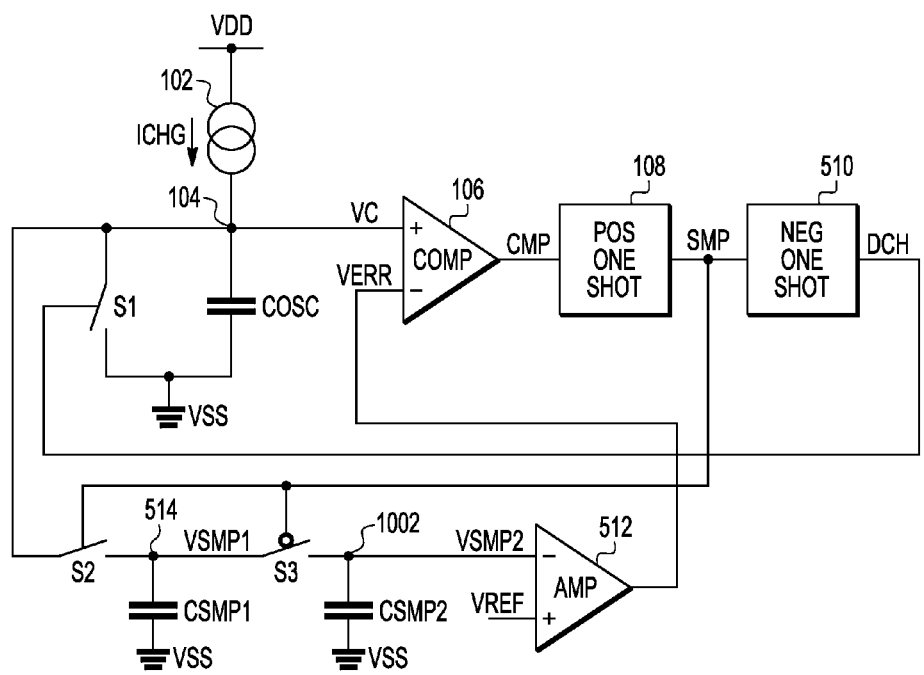
FIG. 10 is a schematic diagram of a clock generator implemented with comparator error compensation according to another embodiment of the present invention for developing a sawtooth waveform using back-to-back sampling capacitors for enhancing stability for wider frequency range.

FIG. 10 is a schematic diagram of a clock generator 1000 implemented with comparator error compensation according to another embodiment of the present invention for developing a sawtooth waveform. The clock generator 1000 is substantially similar to the clock generator 500 in which similar components assume identical reference numbers. The clock generator 1000 may also be used as the clock generator 902 of the IC 900. The circuit configuration of the clock generator 1000 is substantially the same as the clock generator 500 except that the sample capacitor CSMP is replaced by a pair of sample capacitors CSMP1 and CSMP2 separated by an additional normally-closed sample switch S3. The first sample capacitor CSMP1 is coupled between the first sample node 514 and VSS in which node 514 develops a first sample voltage VSMP1. The second sample capacitor CSMP2 is coupled between a second sample node 1002 and VSS in which node 1002 develops a second sample voltage VSMP2. Node 1002 is instead coupled to the negative input of the amplifier 512. The switch S3 has its current terminals coupled between sample nodes 514 and 1002 and is controlled by the SMP signal at the output of the POS one-shot device 108.

The restriction of having the sample capacitor CSMP be greater than the oscillation capacitor COSC to enhance stability of the clock generator 500 is modified for the clock generator 1000. To enhance the stability of the clock generator 1000, the capacitance of CSMP2 is made greater than the capacitance of CSMP1. The capacitance of CSMP1, however, does not have to be greater than COSC, and in fact CSMP1 may have a significantly smaller capacitance value as COSC without compromising stability. In other words, stability is achieved by reducing CSMP1. In one embodiment, for example, CSMP1 is about one-tenth ($^{1}/_{10}{}^{th}$) the capacitance of COSC, and the capacitance of CSMP2 is about ten (10) times that of CSMP1, which means that CSMP2 is about the same size as COSC. Thus, the combined capacitance of CSMP1+CSMP2 is about 1.1 times that of COSC. In this manner, rather than having to incorporate a large integrated capacitor, the use of the back-to-back capacitors CSMP1 and CSMP2 allows the reduction of capacitance of the first sample capacitor CSMP1.

Operation of the clock generator 1000 is substantially similar to that of the clock generator 500 except that the switches S2 and S3 are toggled to opposite states during each sample event. While signal SMP is low during most of each cycle, the switch S2 is open and the switch S3 is closed. Thus, sample nodes 514 and 1002 are shorted together and the capacitances of the capacitors CSMP1 and CSMP2 are added together for a larger capacitance developing the sample voltage provided to the amplifier 512. When SMP is pulsed high, S3 is opened and S2 is closed so that a sample of the voltage of VC is stored on the first sample capacitor CSMP1 developing a new sample voltage VSMP1 on node 514 in a similar manner previously described. When SMP goes back low, however, S2 is opened and S3 is closed so that the sampled voltage is stored on the shorted nodes 514 and 1002 as a single sampled voltage provided by the combined capacitance of the capacitors CSMP1 and CSMP2.

In this manner, the clock generator 1000 provides an adjustable frequency range using the external resistor $R_{EXT}$ and provides suitable stability for a wider frequency range without having to integrate a large sample capacitor. In alternative embodiments, any one or more of the capacitors, e.g., COSC and/or CSMP, may be provided externally for adjusting the frequency of operation.

Figure 11:
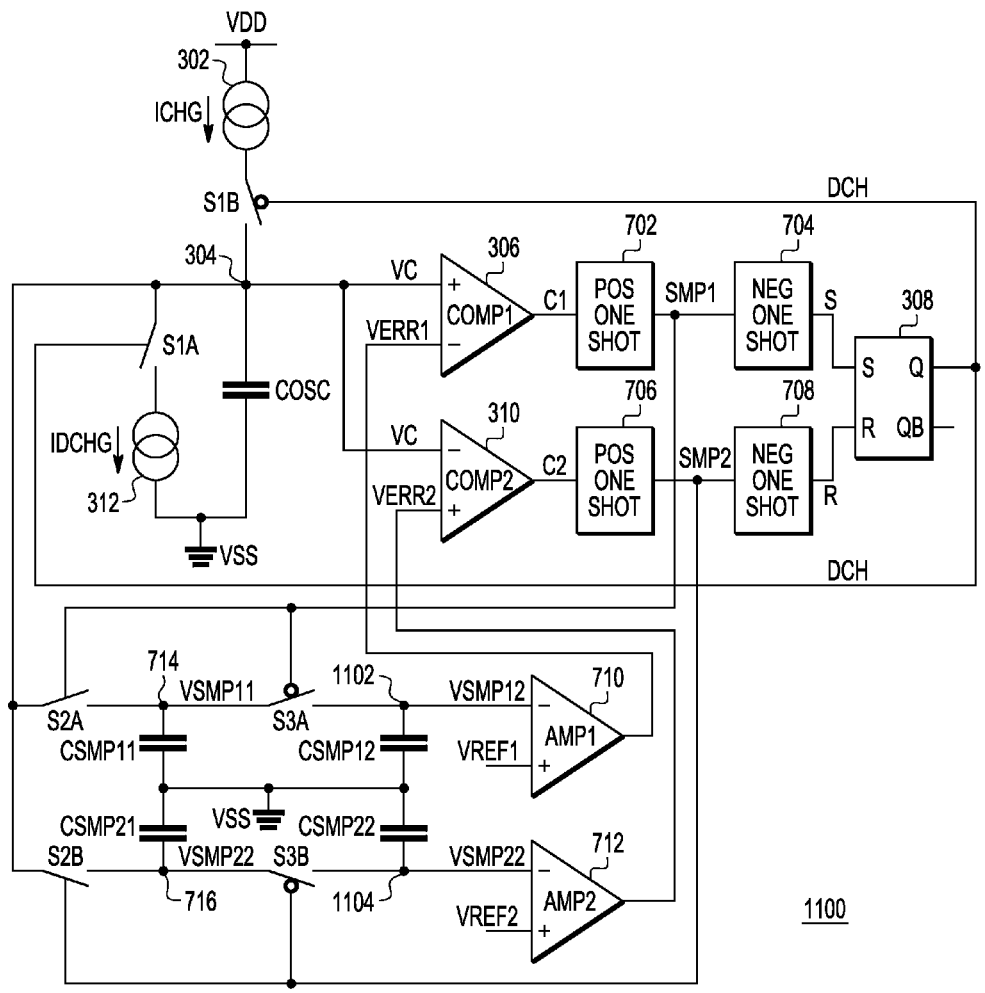
FIG. 11 is a schematic diagram of a clock generator implemented with comparator error compensation according to another embodiment of the present invention for developing a triangular waveform using back-to-back sampling capacitors for enhancing stability for wider frequency range.

FIG. 11 is a schematic diagram of a clock generator 1100 implemented with comparator error compensation according to another embodiment of the present invention for developing a triangular waveform. The clock generator 1100 is substantially similar to the clock generator 700 in which similar components assume identical reference numbers. The clock generator 1100 may also be used as the clock generator 902 of the IC 900. In one embodiment, the external resistor $R_{EXT}$ adjusts ICHG for adjusting the operating frequency, and in an alternative embodiment, $R_{EXT}$ adjusts IDCHG for adjusting the operating frequency. It is noted, however, that the duty cycle is modified when a single external resistor is used. Frequency and duty cycle may be adjusted using two separate resistors as further described below.

The circuit configuration of the clock generator 1100 is substantially the same as the clock generator 700 except that the first sample capacitor CSMP1 is replaced by a pair of sample capacitors CSMP11 and CSMP12 separated by an additional normally-closed sample switch S3A, and the second sample capacitor CSMP2 is replaced by another pair of sample capacitor CSMP21 and CSMP22 separated by another normally-closed sample switch S3B. The sample capacitor CSMP11 is coupled between the sample node 714 and VSS in which node 714 develops a first sample voltage VSMP11. The second sample capacitor CSMP12 is coupled between a second sample node 1102 and VSS in which node 1102 develops a second sample voltage VSMP12. Node 1102 is instead coupled to the negative input of the amplifier 710. The switch S3A has its current terminals coupled between sample nodes 714 and 1102 and is controlled by the SMP1 signal at the output of the POS one-shot device 702. In similar manner, the third sample capacitor CSMP21 is coupled between the third sample node 716 and VSS in which the sample node 716 develops a third sample voltage VSMP21. The fourth sample capacitor CSMP22 is coupled between a fourth sample node 1104 and VSS in which node 1104 develops a fourth sample voltage VSMP22. Node 1104 is instead coupled to the negative input of the amplifier 712. The switch S3B has its current terminals coupled between sample nodes 716 and 1104 and is controlled by the SMP2 signal at the output of the POS one-shot device 706.

In a similar manner as described above for the clock generator 1000, rather than providing sample capacitors with larger capacitance relative to COSC to improve stability for a wider frequency range of operation, the primary sample capacitors CSMP11 and CSMP21 may each have substantially smaller capacitance as compared to COSC. The secondary sample capacitors CSMP12 and CSMP22 have substantially greater capacitance than that of CSMP11 and CSMP21, respectively. In one embodiment, for example, the sample capacitors CSMP11 and CSMP21 may each have one-tenth ($^{1}/_{10}{}^{th}$) the capacitance of COSC, and CSMP12 and CSMP22 may each have 10 times the capacitance of CSMP11 and CSMP21 or about the same capacitance as COSC. In this manner, rather than having to incorporate large integrated capacitors, the use of the back-to-back capacitors CSMP11/CSMP12 and CSMP21/CSMP22 allows the reduction of capacitance of the first sample capacitors CSMP11 and CSMP21.

Operation of the clock generator 1100 is substantially similar to that of the clock generator 700 except that the switches S2A and S3A are toggled to opposite states during each sample event initiated by SMP1, and the switches S2B and S3B are toggled to opposite states during each sample event initiated by SMP2. While signal SMP1 is low, the switch S2A is open and the switch S3A is closed. Thus, sample nodes 714 and 1102 are shorted together and the capacitances of the capacitors CSMP11 and CSMP12 are added together for a larger capacitance developing the sample voltage provided to the amplifier 710. When SMP1 is pulsed high, S3A is opened and S2A is closed so that a sample of the voltage of VC is stored on the first sample capacitor CSMP11 developing a new sample voltage VSMP11 on node 714 in a similar manner previously described. When SMP1 goes back low, however, S2A is opened and S3A is closed so that the sampled voltage is stored on the shorted nodes 714 and 1102 as a single sampled voltage provided by the combined capacitance of the capacitors CSMP11 and CSMP12.

In similar manner, while signal SMP2 is low, the switch S2B is open and the switch S3B is closed. Thus, sample nodes 716 and 1104 are shorted together and the capacitances of the capacitors CSMP21 and CSMP22 are added together for a larger capacitance developing the sample voltage provided to the amplifier 712. When SMP2 is pulsed high, S3B is opened and S2B is closed so that a sample of the voltage of VC is stored on the third sample capacitor CSMP21 developing a new sample voltage VSMP21 on node 716 in a similar manner previously described. When SMP2 goes back low, however, S2B is opened and S3B is closed so that the sampled voltage is stored on the shorted nodes 716 and 1104 as a single sampled voltage provided by the combined capacitance of the capacitors CSMP21 and CSMP22.

In this manner, the clock generator 1100 provides an adjustable frequency range using the external resistor $R_{EXT}$ and provides suitable stability for a wider frequency range without having to integrate large sample capacitors. In alternative embodiments, any one or more of the capacitors, e.g., COSC and/or CSMPx, may be provided externally for adjusting the frequency of operation.

Figure 12:
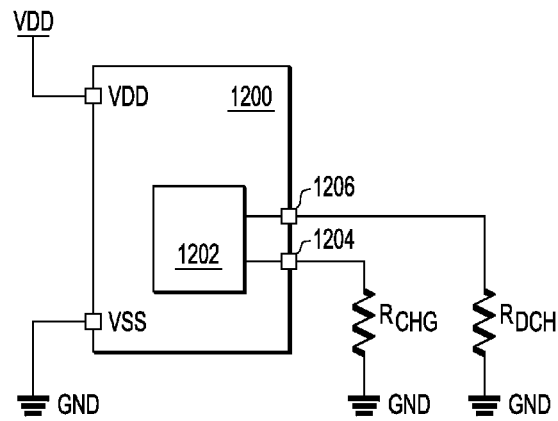
FIG. 12 is a simplified block diagram of a chip or IC incorporating an clock generator implemented according to an embodiment of the present invention for generating a triangular waveform with adjustable duty cycle and frequency and of operation.

FIG. 12 is a simplified block diagram of a chip or IC 1200 incorporating an clock generator 1202 implemented according to an embodiment of the present invention. The IC 1200 includes voltage supply pins VDD and VSS for coupling to external supply voltages. As shown, the IC 1200 includes a VDD pin externally coupled to supply voltage VDD, and a VSS pin externally coupled to ground (GND). The clock generator 1202 is integrated onto the IC 1200 and represents either of the clock generators 700 or 1100 for generating the triangular waveform. Although only the clock generator 1202 is shown on the IC 1200, it is understood that the IC 1200 may include other circuitry or components in which the clock generator 1202 may only be a portion of the circuitry of the IC 1200. Alternatively, the IC 1200 may be a timing chip or the like in which one or more clock generators are incorporated thereon.

The IC 1200 incorporates substantially the entire portion of the clock generator 1202 except that two external resistors $R_{CHG}$ and $R_{DCH}$ may be provided to allow external adjustment of the operating frequency and duty cycle. As shown, the clock generator 1202 is internally coupled to two external pins 1204 and 1206 of the IC 900. The external resistor $R_{CHG}$ is an external component which may be coupled between the pin 1204 and GND, and the external resistor $R_{DCH}$ is an external component which may be coupled between the pin 1206 and GND as illustrated. The configuration of the external resistors $R_{CHG}$ and $R_{DCH}$ provides flexibility for determining the frequency of oscillation and duty cycle by selection of the resistances of $R_{CHG}$ and $R_{DCH}$. In one embodiment, $R_{CHG}$ is used to adjust the charge current ICHG (e.g., provided by current source 302) and $R_{DCH}$ is used to adjust the discharge current IDCHG (e.g., provided by current sink 312). Adjustment of the charge and discharge current allows adjustment of both frequency and duty cycle of the triangular waveform. In one embodiment, the current level for each is increased to a higher current level with smaller resistance values of $R_{CHG}$ and $R_{DCH}$.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A clock generator, comprising:
an oscillator capacitor which develops a charge voltage;
a first sample capacitor which develops a first sample voltage;
a first sample switch coupled between said oscillator capacitor and said first sample capacitor;
a charge circuit configured to charge said oscillator capacitor towards a first voltage level and a discharge circuit configured to discharge said oscillator capacitor towards a second voltage level;
a first comparator configured to compare said charge voltage with a first error voltage and to provide a first compare signal indicative thereof;
a sample and discharge control network configured to control said first sample switch to cause said charge voltage to be sampled by said first sample capacitor as said first sample voltage in response to said first compare signal, and which is configured to then control said discharge circuit to discharge said oscillator capacitor; and
a first amplifier configured to provide said first error voltage based on a difference between said first sample voltage and a predetermined first reference voltage, wherein said first reference voltage corresponds with a target level of said first voltage level.

2. The clock generator of claim 1, wherein said charge circuit continuously charges said oscillator capacitor and wherein said discharge circuit discharges voltage across said oscillator capacitor to zero.

3. The clock generator of claim 2, wherein said sample and discharge control network comprises:
a first trigger device configured to provide a sample signal to momentarily close said first sample switch in response to said first compare signal to sample said charge voltage onto said first sample capacitor as said first sample voltage; and
a second trigger device configured to provide a discharge signal to momentarily close a discharge switch coupled in parallel with said oscillation capacitor in response to said first reset signal to discharge said oscillator capacitor.

4. The clock generator of claim 3, wherein said first and second one-shot devices are configured so that said second trigger device triggers sequentially after triggering of said first trigger device.

5. The clock generator of claim 1, further comprising:
a first supply voltage node, a second supply voltage node, a charge node developing said charge voltage, and a sample node developing said first sample voltage;
wherein said oscillator capacitor is coupled between said charge node and said second supply voltage node, wherein said first sample capacitor is coupled between said first sample node and said second supply voltage node, and wherein said first sample switch is coupled between said charge node and said first sample node;
wherein said charge circuit comprises a current source coupled between said first supply voltage node and said charge node for providing a charge current to said charge node;
wherein said discharge circuit comprises a discharge switch having current terminals coupled between said charge node and said second supply voltage node;
wherein said first amplifier has a negative input coupled to said first sample node, has a positive input receiving said first reference voltage, and has an output providing said first error voltage; and
wherein said first comparator has a positive input coupled to said charge node, has a negative input coupled to said output of said first amplifier, and has an output providing said first compare signal.

6. The clock generator of claim 5, wherein said sample and discharge control network comprises:

a first one-shot device having an input coupled to said output of said first comparator and having an output coupled to a control input of said first sample switch; and a second one-shot device having an input coupled to said output of said first one-shot device and an output coupled to a control input of said discharge switch.

7. The clock generator of claim 1, further comprising:

a second sample capacitor which develops a second sample voltage;

a second sample switch coupled between said oscillator capacitor and said second sample capacitor;

a second comparator configured to compare said charge voltage with a second error voltage and to provide a second compare signal indicative thereof;

a second amplifier configured to provide said second error voltage based on a difference between said second sample voltage and a predetermined second reference voltage, wherein said second reference voltage corresponds with a target level of said second voltage level;

wherein said charge circuit comprises a charge switch coupled to a current source for charging said oscillator capacitor when said charge switch is closed, and wherein said discharge circuit comprises a discharge switch coupled to a current sink for discharging said oscillator capacitor when said discharge switch is closed;

wherein said sample and discharge control network is configured to control said discharge circuit to discharge said oscillator capacitor by closing said discharge switch and opening said charge switch; and wherein said sample and discharge control network is further configured to control said second sample switch to cause said charge voltage to be sampled by said second sample capacitor as said second sample voltage in response to said second compare signal, and which is configured to then open said discharge switch and close said charge switch.

8. The clock generator of claim 7, wherein said charge voltage ramps up at a first rate towards said first voltage level while said charge switch is closed, and which ramps down at a second rate towards said second voltage level while said discharge switch is closed.

9. The clock generator of claim 7, wherein said sample and discharge control network comprises:

a first trigger device configured to provide a first sample signal to momentarily close said first sample switch in response to said first compare signal to sample said charge voltage onto said first sample capacitor as said first sample voltage;

a second trigger device configured to provide a set signal in response to said first sample signal;

a third trigger device configured to provide a second sample signal to momentarily close said second sample switch in response to said second compare signal to sample said charge voltage onto said second sample capacitor as said second sample voltage;

a fourth trigger device configured to provide a reset signal in response to said second sample signal; and a latch which is configured to open said charge switch and to close said discharge switch in response to said set signal, and which is configured to close said charge switch and to open said discharge switch in response to said reset signal.

10. The clock generator of claim 9, wherein said second trigger device is configured to trigger after triggering of said first trigger device, and wherein said fourth trigger device is configured to trigger after triggering of said third trigger device.

11. The clock generator of claim 7, further comprising:

a first supply voltage node, a second supply voltage node, a charge node developing said charge voltage, a first sample node developing said first sample voltage, and a second sample node developing said second sample voltage;

wherein said oscillator capacitor is coupled between said charge node and said second supply voltage node, wherein said first sample capacitor is coupled between said first sample node and said second supply voltage node, wherein said second sample capacitor is coupled between said second sample node and said second supply voltage node, wherein said first sample switch is coupled between said charge node and said first sample node, and wherein said second sample switch is coupled between said charge node and said second sample node;

wherein said current source and said charge switch are coupled in series between said first supply voltage node and said charge node, and wherein said discharge switch and said current sink are coupled in series between said charge node and said second supply voltage node;

wherein said first amplifier has a negative input coupled to said first sample node, has a positive input receiving said first reference voltage, and has an output providing said first error voltage;

wherein said second amplifier has a negative input coupled to said second sample node, has a positive input receiving said second reference voltage, and has an output providing said second error voltage;

wherein said first comparator has a positive input coupled to said charge node, has a negative input coupled to said output of said first amplifier, and has an output providing said first compare signal; and wherein said second comparator has a positive input coupled to said charge node, has a negative input coupled to said output of said second amplifier, and has an output providing said second compare signal.

12. The clock generator of claim 11, wherein said sample and discharge control network comprises:

a first one-shot device having an input coupled to said output of said first comparator and having an output coupled to a control input of said first sample switch;

a second one-shot device having an input coupled to said output of said first one-shot device and having an output;

a third one-shot device having an input coupled to said output of said second comparator and having an output coupled to a control input of said second sample switch;

a fourth one-shot device having an input coupled to said output of said third one-shot device and having an output; and a latch having a set input coupled to said output of said second one-shot device, having a reset input coupled to said output of said fourth one-shot device, and having at least one output coupled to a control input of said charge switch and to a control input of said discharge switch.

13. A method of generating a clock signal, comprising:

changing a charge signal towards a first level in a first operative state, and changing the charge signal towards a different second level in a second operative state;

comparing the charge signal with a first error signal and providing a first compare signal indicative thereof;

sampling the charge signal in response to the first compare signal and providing a first sample signal;

amplifying a difference between the first sample signal and a predetermined first reference level and providing the first error signal indicative thereof; and switching between the first and second operative states after said sampling the charge signal in response to the first compare signal and providing the first sample signal.

14. The method of claim 13, wherein the first reference level corresponds with the first level and wherein said providing a first compare signal corresponds with the charge signal reaching the first level.

15. The method of claim 13, wherein said changing a charge signal towards a first level comprises ramping the charge signal towards the first level, and wherein said changing the charge signal towards a second level comprises resetting the charge signal to the second level.

16. The method of claim 13, wherein said changing a charge signal towards a first level comprises charging a first capacitor, wherein said changing the charge signal towards a second level comprises discharging the first capacitor, and wherein said sampling the charge signal comprises transferring charge from the first capacitor to a second capacitor.

17. The method of claim 16, wherein said charging a first capacitor comprises continuously applying a charge current to the first capacitor in the first operative state, and wherein said discharging the first capacitor comprises shorting its terminals in response to the first compare signal after said sampling the charge signal.

18. The method of claim 13, further comprising:
comparing the charge signal with a second error signal and providing a second compare signal indicative thereof;
sampling the charge signal in response to the second compare signal and providing a second sample signal;
amplifying a difference between the second sample signal and a predetermined second reference level and providing the second error signal indicative thereof, wherein the first reference level corresponds with the first level of the charge signal and wherein the second reference level corresponds with the second level of the charge signal; and
switching from the first operative state to the second operative state after said sampling the charge signal and providing the first sample signal in response to the first compare signal, and switching from the second operative state to the first operative state after said sampling the charge signal and providing the second sample signal in response to the second compare signal.

19. The method of claim 18, wherein:
said changing a charge signal towards a first level in a first operative state comprises charging an oscillation capacitor at a first rate towards a first voltage determined by the first reference level, and wherein said changing the charge signal towards a second level in a second operative state comprises discharging the oscillation capacitor at a second rate towards a second voltage determined by the second reference level;
wherein said sampling the charge signal in response to the first compare signal and providing a first sample signal comprises momentarily closing a first sample switch to transfer charge of the oscillation capacitor to a first sample capacitor and providing a first sample voltage;
wherein said sampling the charge signal in response to the second compare signal and providing a second sample signal comprises momentarily closing a second sample switch to transfer charge of the oscillation capacitor to a second sample capacitor and providing a second sample voltage; and wherein said switching from the first operative state to the second operative state comprises removing a charge current from the oscillation capacitor and applying a discharge current to the oscillation capacitor, and wherein said switching from the second operative state to the first operative state comprises applying the charge current to the oscillation capacitor and removing the discharge current from the oscillation capacitor.

20. The method of claim 19, wherein said momentarily closing a first sample switch comprises triggering a first momentary trigger device and wherein said momentarily closing a second sample switch comprises triggering a second momentary trigger device.

21. A clock generator, comprising:
an oscillator capacitor which develops a charge voltage;
a first sample capacitor which develops a first sample voltage and a second sample capacitor which develops a second sample voltage;
a first sample switch coupled between said oscillator capacitor and said first sample capacitor and a second sample switch coupled between said first sample capacitor and second sample capacitor;
a charge circuit configured to charge said oscillator capacitor towards a first voltage level and a discharge circuit configured to discharge said oscillator capacitor towards a second voltage level;
a first comparator configured to compare said charge voltage with a first error voltage and to provide a first compare signal indicative thereof;
a sample and discharge control network configured to close said first sample switch to cause said charge voltage to be sampled by said first sample capacitor as said first sample voltage in response to said first compare signal and then to open said first sample switch and close said second sample switch to cause said first sample voltage to be sampled by said second sample capacitor as said second sample voltage, and which is configured to control said discharge circuit to discharge said oscillator capacitor after said first sample switch is opened; and
a first amplifier configured to provide said first error voltage based on a difference between said second sample voltage and a predetermined first reference voltage, wherein said first reference voltage corresponds with a target level of said first voltage level.

22. The clock generator of claim 21, further comprising:
a third sample capacitor which develops a third sample voltage and a fourth sample capacitor which develops a fourth sample voltage;
a third sample switch coupled between said oscillator capacitor and said third sample capacitor and a fourth sample switch coupled between said third sample capacitor and said fourth sample capacitor;
a second comparator configured to compare said charge voltage with a second error voltage and to provide a second compare signal indicative thereof;
a second amplifier configured to provide said second error voltage based on a difference between said fourth sample voltage and a predetermined second reference voltage, wherein said second reference voltage corresponds with a target level of said second voltage level;
wherein said charge circuit comprises a charge switch coupled to a current source for charging said oscillator capacitor when said charge switch is closed, and wherein said discharge circuit comprises a discharge switch coupled to a current sink for discharging said oscillator capacitor when said discharge switch is closed;

wherein said sample and discharge control network is configured to control said discharge circuit to discharge said oscillator capacitor by closing said discharge switch and opening said charge switch; and wherein said sample and discharge control network is further configured to close said third sample switch to cause said charge voltage to be sampled by said third sample capacitor as said third sample voltage in response to said second compare signal and then to open said third sample switch and close said fourth sample switch to cause said third sample voltage to be sampled by said fourth sample capacitor as said fourth sample voltage, and which is further configured to open said discharge switch and close said charge switch after said third sample switch is opened.

23. The clock generator of claim 21, wherein a first capacitance of said first sample capacitor is smaller than a second capacitance of said oscillator capacitor, and wherein a third capacitance of said second sample capacitor is larger than said first capacitance of said first sample capacitor.

24. The clock generator of claim 23, wherein said second capacitance of said oscillator capacitor and said third capacitance of said second sample capacitor are equivalent.

* * * * *